(12) United States Patent
Rubio

(10) Patent No.: US 8,305,034 B2
(45) Date of Patent: Nov. 6, 2012

(54) BATTERY MONITORING SYSTEM

(75) Inventor: Josep Maria Roset Rubio, Tarragona (ES)

(73) Assignee: Lear Corporation, Southfield, MI (US)

( * ) Notice: Subject to any disclaimer, the term of this patent is extended or adjusted under 35 U.S.C. 154(b) by 524 days.

(21) Appl. No.: 12/486,847

(22) Filed: Jun. 18, 2009

(65) Prior Publication Data

US 2010/0019733 A1    Jan. 28, 2010

Related U.S. Application Data

(60) Provisional application No. 61/135,691, filed on Jul. 23, 2008.

(51) Int. Cl.
*H02J 7/00* (2006.01)
*H02J 7/14* (2006.01)

(52) U.S. Cl. ........ 320/105; 320/104; 439/504; 439/754; 439/763

(58) Field of Classification Search .................. 320/104, 320/105; 439/504, 754, 763
See application file for complete search history.

(56) References Cited

U.S. PATENT DOCUMENTS

| | | |
|---|---|---|
| 2,324,072 A | 7/1943 | Helm |
| 4,149,093 A | 4/1979 | D'Alessio et al. |
| 4,252,390 A | 2/1981 | Bowling |
| 4,470,654 A | 9/1984 | Friedman |
| 4,572,878 A | 2/1986 | Daugherty |
| 4,675,255 A | 6/1987 | Pfeifer et al. |
| 4,813,128 A | 3/1989 | Massopust |
| 5,179,340 A | 1/1993 | Rogers |
| 5,218,288 A | 6/1993 | Mickal et al. |
| 5,598,087 A | 1/1997 | Hara |
| 5,606,242 A | 2/1997 | Hull et al. |
| 5,629,680 A | 5/1997 | Makhija |
| 5,645,448 A | 7/1997 | Hill |
| 5,877,563 A | 3/1999 | Krappel et al. |
| 5,903,154 A | 5/1999 | Zhang et al. |
| 5,939,855 A | 8/1999 | Proctor et al. |
| 5,939,861 A | 8/1999 | Joko et al. |
| 6,001,506 A | 12/1999 | Timmons et al. |
| 6,034,521 A | 3/2000 | Eckardt |
| 6,163,133 A | 12/2000 | Laig-Horstebrock et al. |
| 6,218,805 B1 * | 4/2001 | Melcher ......................... 320/105 |
| 6,285,163 B1 | 9/2001 | Watanabe et al. |

(Continued)

FOREIGN PATENT DOCUMENTS

DE    4410061 A1    9/1994

(Continued)

OTHER PUBLICATIONS

Meissner et al., "Battery Monitoring and Electrical Energy Management Precondition for Future Vehicle Electric Power Systems," Journal of Power Sources, pp. 79-98, 2003, Elsevier Science B.V., 2003.

(Continued)

*Primary Examiner* — Samuel Berhanu
(74) *Attorney, Agent, or Firm* — Brooks Kushman P.C.

(57) ABSTRACT

A battery monitoring system (BMS) configured for use in measuring operating conditions of a battery or other source of electric current. The BMS may include a housing configured to include a dampening element between a shunt and connection arm in order to limit the likelihood of vibrations and other forces acting on the BMS shorting or otherwise disrupting electrical connections used to measure current through the shunt.

19 Claims, 5 Drawing Sheets

U.S. PATENT DOCUMENTS

| | | |
|---|---|---|
| 6,285,191 B1 | 9/2001 | Gollomp et al. |
| 6,304,062 B1 | 10/2001 | Batson |
| 6,331,762 B1 | 12/2001 | Bertness |
| 6,479,186 B1 | 11/2002 | Nemoto et al. |
| 6,489,693 B1 | 12/2002 | Hetzler |
| 6,551,147 B2 * | 4/2003 | Wakata et al. ............... 439/754 |
| 6,573,723 B2 | 6/2003 | Baston |
| 6,628,102 B2 | 9/2003 | Batson |
| 6,633,165 B2 | 10/2003 | Bertness |
| 6,787,935 B2 | 9/2004 | Heim |
| 6,805,090 B2 | 10/2004 | Bertness et al. |
| 6,850,037 B2 | 2/2005 | Bertness |
| 6,876,174 B1 | 4/2005 | Samittier Marti et al. |
| 6,901,350 B2 | 5/2005 | Loehr et al. |
| 6,909,287 B2 | 6/2005 | Bertness |
| 6,918,800 B2 | 7/2005 | Ota et al. |
| 6,943,455 B1 | 9/2005 | Maxwell |
| 6,956,166 B2 | 10/2005 | Kishimoto |
| 7,012,404 B2 | 3/2006 | Batson |
| 7,039,533 B2 | 5/2006 | Bertness et al. |
| 7,081,755 B2 | 7/2006 | Klang et al. |
| 7,164,272 B1 | 1/2007 | Borrego Bel et al. |
| 7,170,295 B2 | 1/2007 | Hetzler |
| 7,381,101 B2 | 6/2008 | Roset et al. |
| 7,388,383 B2 | 6/2008 | Kawakami et al. |
| 7,405,570 B2 | 7/2008 | Hirthammer |
| 7,500,888 B2 | 3/2009 | Roset et al. |
| 2001/0023037 A1 | 9/2001 | Kieninger et al. |
| 2001/0033171 A1 | 10/2001 | Batson |
| 2002/0011959 A1 | 1/2002 | Liu |
| 2002/0024334 A1 | 2/2002 | Dames |
| 2002/0180405 A1 | 12/2002 | Batson |
| 2002/0182493 A1 | 12/2002 | Ovshinsky et al. |
| 2003/0038637 A1 | 2/2003 | Bertness et al. |
| 2003/0054700 A1 | 3/2003 | Korte et al. |
| 2003/0057770 A1 | 3/2003 | Heim |
| 2003/0080835 A1 | 5/2003 | Hreish et al. |
| 2003/0141844 A1 | 7/2003 | Fiebig et al. |
| 2003/0203681 A1 | 10/2003 | Liang |
| 2003/0232546 A1 | 12/2003 | Davis |
| 2003/0236033 A1 | 12/2003 | Freitag |
| 2004/0012396 A1 | 1/2004 | Batson |
| 2004/0048142 A1 | 3/2004 | Marusak et al. |
| 2004/0056634 A1 | 3/2004 | Seils et al. |
| 2004/0087219 A1 | 5/2004 | Freitag |
| 2004/0212342 A1 | 10/2004 | Batson |
| 2004/0232918 A1 | 11/2004 | Bertness et al. |
| 2005/0014408 A1 | 1/2005 | Swiatek et al. |
| 2005/0035737 A1 | 2/2005 | Elder et al. |
| 2005/0057865 A1 * | 3/2005 | Veloo et al. ............... 361/56 |
| 2005/0058892 A1 | 3/2005 | Ovshinsky et al. |
| 2005/0101197 A1 | 5/2005 | Wirth |
| 2005/0190519 A1 | 9/2005 | Brown et al. |
| 2005/0202731 A1 | 9/2005 | Brito |
| 2005/0264296 A1 | 12/2005 | Philbrook |
| 2006/0003627 A1 | 1/2006 | Freitag |
| 2006/0057899 A1 | 3/2006 | Tokunaga |
| 2006/0076466 A1 | 4/2006 | Serra |
| 2006/0170529 A1 | 8/2006 | Shoji |
| 2006/0238951 A1 | 10/2006 | Cetiner et al. |
| 2007/0074905 A1 | 4/2007 | Lin et al. |
| 2007/0194747 A1 | 8/2007 | Alvarez-Troncoso et al. |
| 2007/0216407 A1 | 9/2007 | Yamaguchi |
| 2008/0238431 A1 | 10/2008 | Schimmel |
| 2008/0309469 A1 | 12/2008 | Ferre Fabregas et al. |
| 2009/0039865 A1 | 2/2009 | Fernandez |
| 2009/0195252 A1 | 8/2009 | Kerbel |
| 2009/0212779 A1 | 8/2009 | Wenger |
| 2009/0224768 A1 | 9/2009 | Dollansky et al. |

FOREIGN PATENT DOCUMENTS

| | | |
|---|---|---|
| DE | 4429633 A1 | 2/1996 |
| DE | 10039472 A1 | 2/2002 |
| DE | 102004049153 A1 | 4/2006 |
| DE | 102005019569 A1 | 11/2006 |
| EP | 0560468 A1 | 2/1993 |
| EP | 1411364 A1 | 4/2004 |
| EP | 1632781 A1 | 3/2006 |
| EP | 1632782 A1 | 3/2006 |
| FR | 2208117 | 6/1974 |
| GB | 2388975 A | 11/2003 |
| JP | 11170932 A | 6/1999 |
| WO | 9114600 A1 | 10/1991 |
| WO | 9633078 A1 | 10/1996 |
| WO | 9954744 A1 | 10/1999 |
| WO | 0127641 A1 | 4/2001 |
| WO | 0131718 A2 | 5/2001 |
| WO | 0214887 A1 | 2/2002 |
| WO | 02054096 A1 | 7/2002 |
| WO | 02082617 A1 | 10/2002 |
| WO | 2005008265 A1 | 1/2005 |
| WO | 2006034897 A1 | 4/2006 |
| WO | 2008151181 A1 | 12/2008 |

OTHER PUBLICATIONS van Bree et al., "Prediction of Battery Behavior Subject to High Rate Partial State-Of-Charge," IEEE Xplore, 8 pages, Nov. 5, 2008.

* cited by examiner

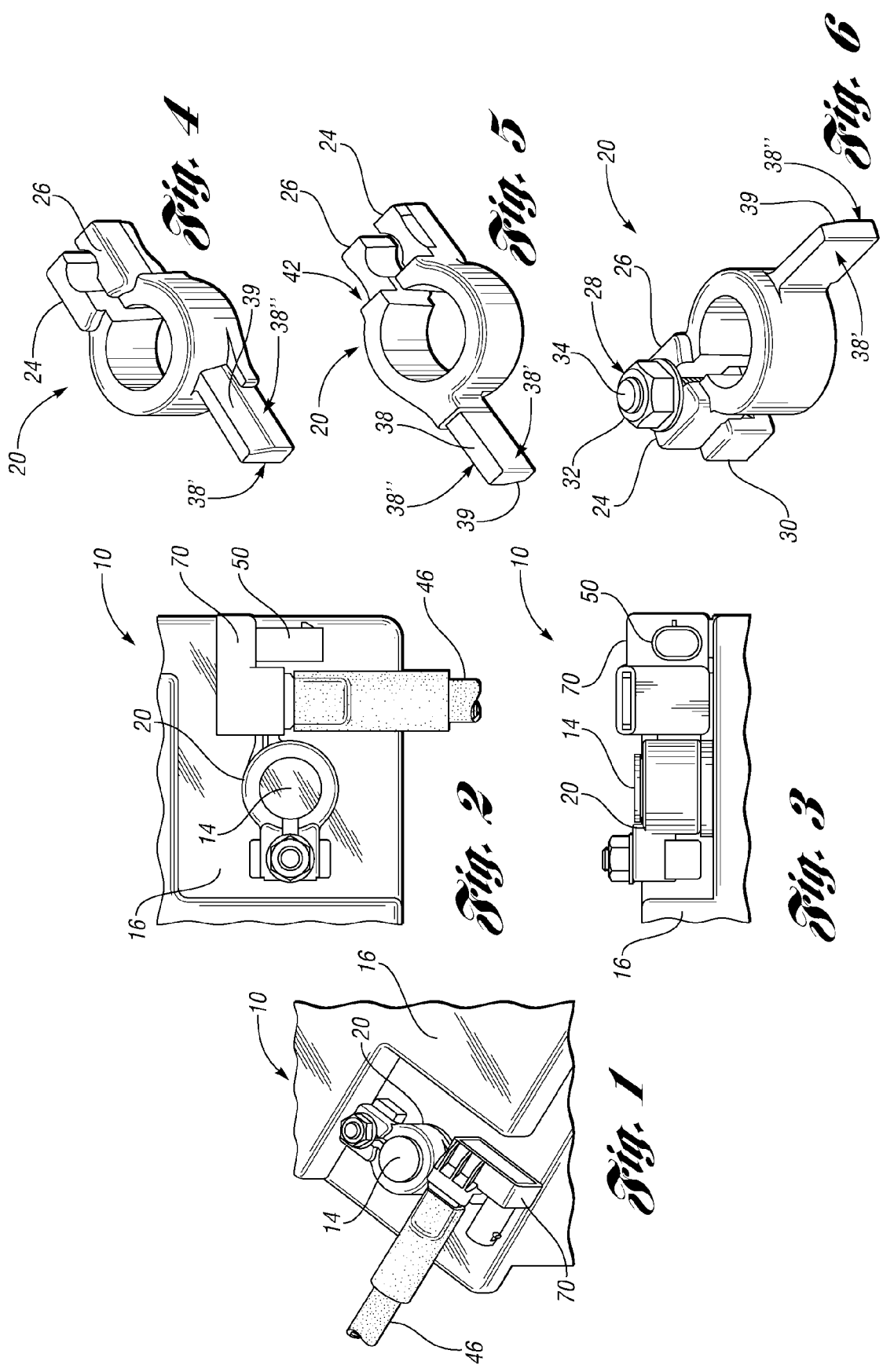

BATTERY MONITORING SYSTEM

CROSS-REFERENCE TO RELATED APPLICATIONS

This application claims the benefit of U.S. provisional application Ser. No. 61/135,691 filed Jul. 23, 2008.

BACKGROUND OF THE INVENTION

1. Field of the Invention

The present invention relates to battery monitoring systems of the type that can be connected to a battery post to measure battery operating conditions.

2. Background Art

Hybrid and non-hybrid vehicles may be equipped with energy storage devices, such as batteries for powering the vehicle and other devices within the vehicle. A battery post connector may be connected to a battery post and configured to sense battery operating conditions. These types of connectors may be employed in automotive vehicles having lead-acid or some other type of battery or similar energy storage device in order to report battery operating conditions to a junction box or other vehicle system controller that may use the information for any number of purposes.

Vehicles having batteries or other similar types of passive energy storage devices may experience any number of forces during vehicle operation. These forces may induce vibrations that can make it difficult to sense current flow from the battery in the event the vibrations disrupt an electrical connection between the battery post connector and electronics used to sense current flow through the connector. The inability to accurately sense and report the battery operating conditions can be problematic to the devices rely on accurate information to control other vehicle subsystems.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

FIGS. 1-3 illustrate a battery monitoring system (BMS) in accordance with one non-limiting aspect of the present invention;

FIGS. 4-6 illustrate a terminal of the BMS in accordance with one non-limiting aspect of the present invention;

DETAILED DESCRIPTION OF THE PREFERRED EMBODIMENT(S)

Figure 9:
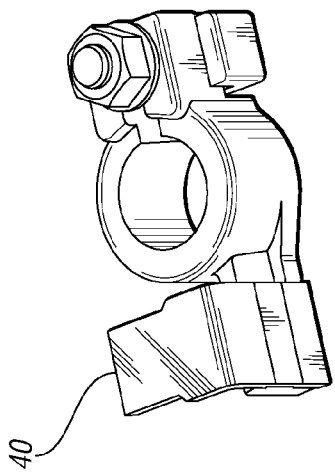
FIGS. 7-9 illustrate attachment of a shunt to the terminal in accordance with one non-limiting aspect of the present invention.

FIGS. 1-3 illustrate a battery monitoring system (BMS) 10 in accordance with one non-limiting aspect of the present invention. The BMS 10 may be connected to a battery post 14 of a battery 16, such as but not limited to a lead-acid or other energy storage/output device (capacitor, fuel cell, etc.) commonly employed within vehicles. The BMS 10 may be securely connected to the battery post 14 with compressive tightening of a terminal 20 or other suitable connection. The BMS 10 may be configured or otherwise programmed to support any number of operations, such as but not limited to measuring/sensing current, voltage, and temperatures associated with the battery 16.

The terminal 20 may comprise a tinned brass or other material suitable for conducting electricity from the battery post 14. The terminal 20 may be configured for attachment to a cylindrical, conical or other shaped battery post 14. FIGS. 4-6 illustrate the terminal being die-cast into a particular shape in accordance with one non-limiting aspect of the present invention. The terminal 20 is shown to include two clamps 24, 26 that compress together with vertical tightening of a screwing system 28. A face (not shown) of a plate 30 used in the screwing system 28 may be angled or otherwise shaped to cause the clamp 24, 26 to move together with downward compression of a nut 32 and bolt 34 arrangement.

Figure 8:
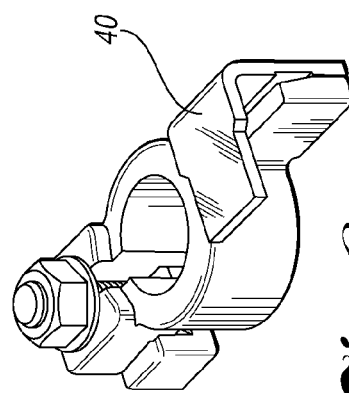
Figure 7:
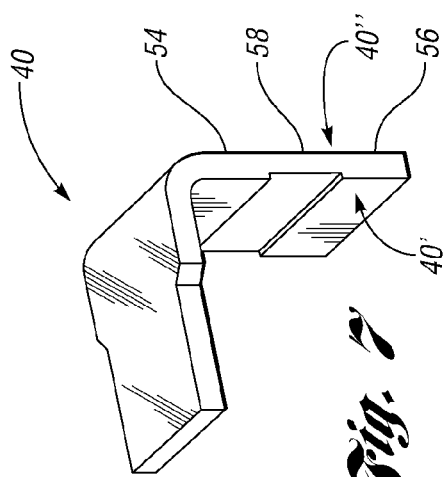

An arm 38 extends opposite to the side of the screwing system 28 to facilitate electrical connection to a shunt 40 (see FIGS. 7-9). A bottom of the arm 38 may be flush with a bottom of the screwing system 28. An offset 42 (see FIG. 5) may be included to facilitate a common elevation along the bottom side of the terminal 20 and screwing system 28. The arm 38 may include a first side 38' and a second side 38" that are generally vertical or parallel to the post 14. A portion 39 of the arm 38 may be angled relative to the rest of the second side 38 such that the cross-section is differentiated from the portion below it. The electrical connection supported by the arm 38 may be used to connect the battery post 14 to other vehicle elements (not shown).

The BMS 10 may include a network interface 50 for interfacing signals with a network vehicle element (not shown), such as but not limited to a vehicle system controller, junction box, bus, network etc. The network interface 50 may be used to interface any number of signals between the BMS 10 and the vehicle system controller or other network vehicle element, i.e., any element not intended to exchange current directly with the battery 16. For example, one or two-way communications may be established with the BMS 10 to facilitate any number of operations, such as but not limited operations associated with sensing and measuring current, voltage, temperature, and other operating parameters of the battery.

FIGS. 7-9 illustrate attachment of the shunt 40 to the terminal 20 in accordance with one non-limiting aspect of the present invention. The shunt 40 may comprise any material have properties sufficient to facilitate electrical connectivity between the terminal 20 and the wire 46. The shunt 40 is shown as a bi-metallic object having copper alloy portions 54, 56 and a resistive copper alloy portion 58, such as but not limited to manganin. The copper portions 54, 56 correspond with the ends of the shunt 40 and the resistive copper alloy portion 58 may be arranged therebetween such that current must flow in either direction from through one copper portion, through the resistive copper alloy portion, and finally through the other copper, depending on whether the battery 16 is charging or discharging.

The resistive copper alloy portion 58 may be used as a measuring element suitable for conducting high currents. The other copper alloy portions 54, 56 may be positioned on opposite sides of the measurement portion 58. The shunt 40 may have first side 40' and a second side 40". The first side 40' may be facing the second side 38" of the arm 38. A cross-section of the shunt 40 corresponding with the measurement portion 58 may be less that the non-measurement portions 54, 56 in order to form a slight recess on the first side 40' relative to a plane (not shown) corresponding with the corresponding first side 40' of the non-measurement portions 54, 56.

While different materials are used, the shape or other geometrical characteristics of the shunt 40 can be adjusted to provide a suitable measurement reference, with or without the manganin portion 58. The known resistive characteristics of the resistor copper alloy 58 may be used in conjunction with the voltage drop to determine current flow through the shunt 40. In this manner, the present invention is able to sense voltage and current associated with the battery 16. The known resistivity of the resistor copper alloy portion 58 can be helpful in assuring the accuracy and consistency of the current calculations. Of course, the present invention is not intended to be limited to the shunt 40 having the resistive copper alloy portion and fully contemplates the use of any number of other suitable materials, including making the shunt out of a single material/composition, i.e., without the bi-metallic composition.

Figure 12:
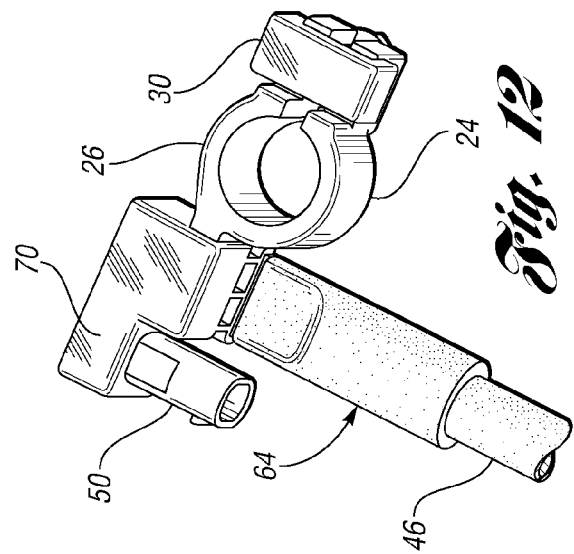
FIGS. 10-12 illustrate attachment of the shunt to a cable in accordance with one non-limiting aspect of the present invention.
Figure 11:
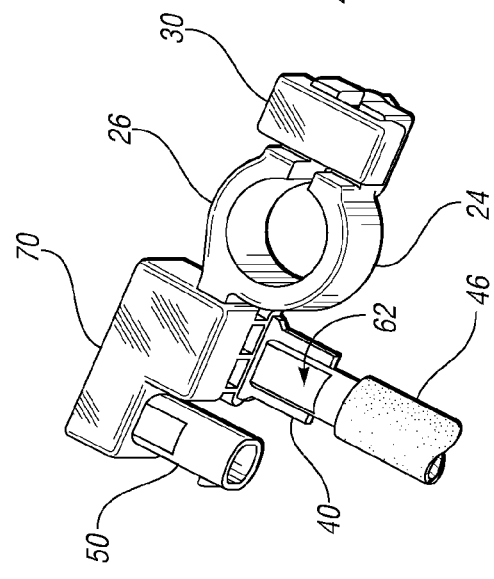
Figure 10:
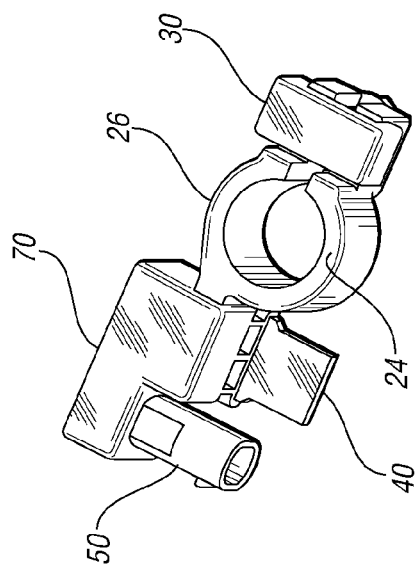

As shown in FIGS. 10-12, an electrical connection may be established between at a first end of the shunt 40 and a cable, wire, or other element 46 suitable for conducting electricity to another element within the vehicle, such as but not limited to a vehicle chassis (not shown), grounding element, etc. The vehicle connector 46 may be suitable for use in conducting energy between the battery 16 and a vehicle element. The cable 46 may include an outer insulated portion surrounding a copper or other suitable electrically conducting material. The shunt 40 may be connected at a second end, such as by welding, soldering, or other fastening, to the terminal 20 and at the other, first end to strands of wires 62 enclosed within an insulating portion of the cable 46.

A soldering machine or other welding element may be configured to compress the wires 62 from their circular shape within the cable 46 to a flatter shape more suitable for fastening to the shunt 40. Once the wires 62 are fastened to the shunt 40, or in the same assembly process, an insulated material 64 may be heat shrunk over the connection region 62. For example, a shrink wrap material may be applied around the shunt 40 and compressed for a snug fit by heating. The wrap 64 may provide insulation to the conducting portion of the vehicle connector and/or additional insulation, such as to cover a gap between where the shunt 40 and beginning of the cable insulation.

The connection of the shunt 40 to the terminal 20 can be particularly susceptible to vibrations and other forces associated with vehicle operations. For example, the shunt 40 may be soldered to the wire 46 in order to provide a secure mechanical connection, but at the same time this connection may permit vibrations or other forces associated with the vehicle chassis or other vehicle elements to travel up the wire 46 to the connection between the shunt 40 and wire 46. The receptivity of the BMS 10 to these and other vibrations can become problematic for the electronic elements, connections, and other features of the connector that are used to perform the various operations associated with determining battery current, voltage, temperatures, etc.

Figure 13:
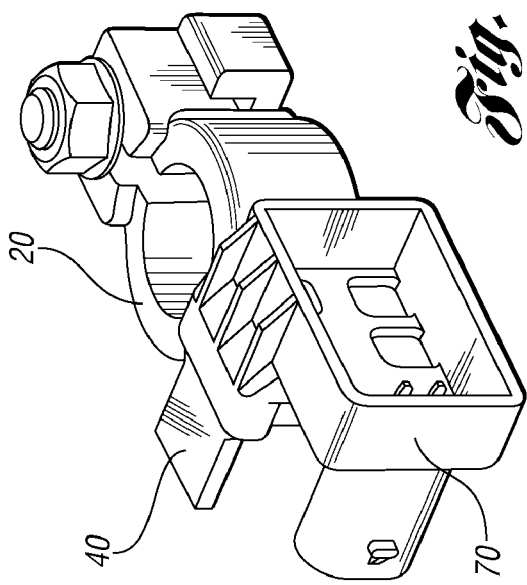
FIGS. 13-15 illustrate a housing of the BMS in accordance with one non-limiting aspect of the present invention.
Figure 14:
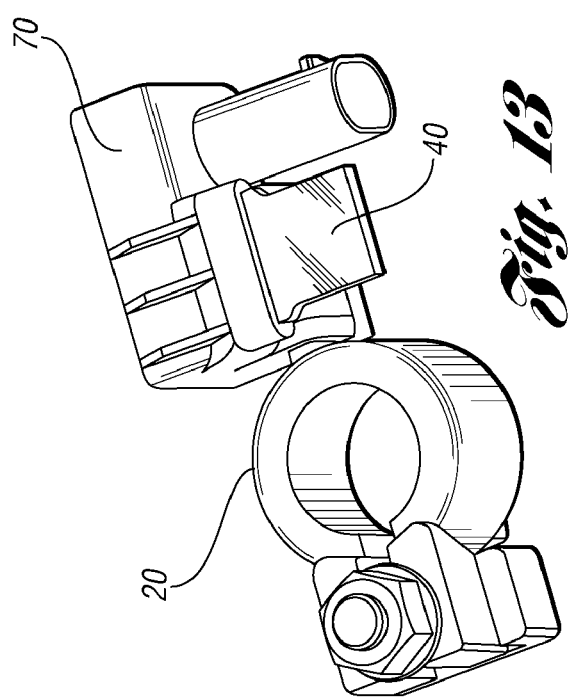
Figure 15:
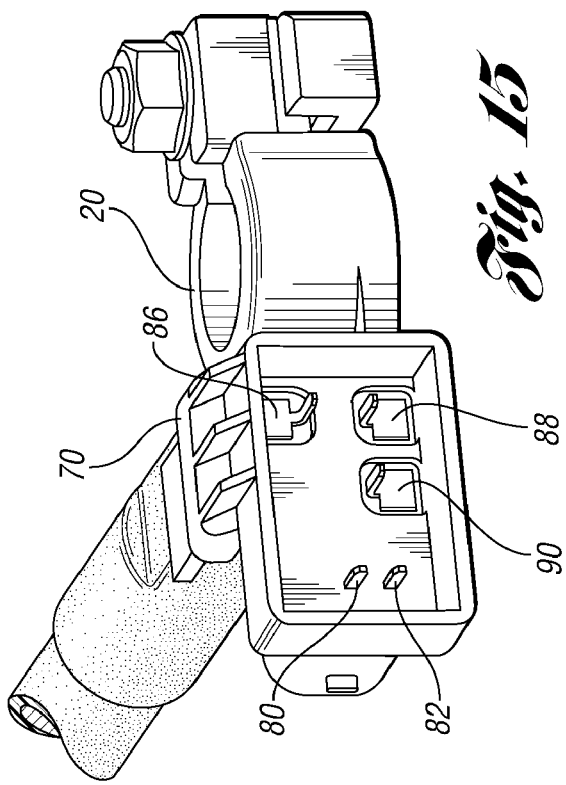

FIGS. 13-15 illustrate a housing 70 configured in accordance with one non-limiting aspect of the present invention to limit the likelihood of vibrations interfering with measurement of current flow through the shunt 40. The housing 70 may be included around the shunt 40 and a printed circuit board (PCB) 74 (see FIG. 16) used to assess battery operations. The housing 70 may comprise a non-conducting material configured for covering the first side 38' of the terminal 20 and the second side 40" of the shunt 40. The housing 70 may be used to electrically isolate the shunt 40 and terminal adapter 20.

The housing 70 may comprise any suitable, electrically isolating or non-conducting material. The housing 70 may be molded around the terminal 20 and shunt 40 after the shunt 40 is attached. Connection pins 80, 82 may be over-molded with the housing 70 to facilitate electrically connecting the network interface 50 to the PCB 74.

Openings may be included in the housing 70 to facilitate attachment of connection tabs 86, 88, 90. The tabs 86, 88, 90 may be welded or otherwise electrically secured to the shunt 40. The tabs 86, 88, 90 may include a shoulder or other offset to facilitate offsetting items place over top of the tabs 86, 88, 90, i.e., PCB 74. The tabs 86, 88, 90 may include footprints extending over a portion of the copper portions 54, 56 of the shunt 40 to facilitate measuring the voltage drop across the resistive portion 58. The pins 86, 88, 90 maybe included within or in close proximity to the outside the boundaries of the copper alloy portion 58 in order to facilitate sensing of the voltage drop therebetween.

The connection tabs 86, 88, 90 are shown at a right angle but the present invention fully contemplates the tabs having other configurations, such as but not limited to the s-shaped portion. The connector tabs 86, 88, 90 may be configured in the manner described above and/or as compliant type pins. The compliant pin configuration may rely on a press-fit between the shunt and PCB 74 to establish an electrical connection for use in assessing battery operations. The compliant pins may also be configured to provide an electrical connecting without the mechanical connection produced with the press-fitting.

The illustrate arrangement includes one tab 86 on one side of the manganin 58 and two tabs 88, 90 on the other. The vertically aligned tabs 86, 88 may be electrically connected to a voltage measuring device on the PCB 74. The device may measure the voltage drop to assess current flow. The other pin 90 may be a grounding pin. The grounding pin 90 may be used to provide an electrical ground for the PCB to the negative battery pole. The grounding pin is shown to be downstream of the vertically aligned pins. The order of these pins 86, 88, 90 may be switched such that the ground 90 is upstream from the voltage measuring pins 86, 88 in order to connect the ground pin 90 closer to the battery pole 14.

Having two pins 88, 90 on the same, 'negative' side of the manganin 58 may be helpful in limiting noise and other interferences from influencing the voltage drop measurements. The various components included on the PCB 74, such as current monitoring device (not shown), can generate noise and other interferences. The transmission of these interferences to the voltage measurement elements may be limited by the direct connection to the negative side of the shunt 40. This allows the voltage measurement device to sense voltage drop between two connections 86, 88 that are not directly connected to other noise generating elements of the PCB 74.

Figure 17:
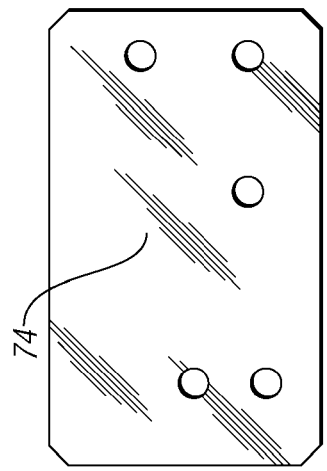
FIGS. 16-18 illustrate a PCB of the BMS in accordance with one non-limiting aspect of the present invention.
Figure 16:
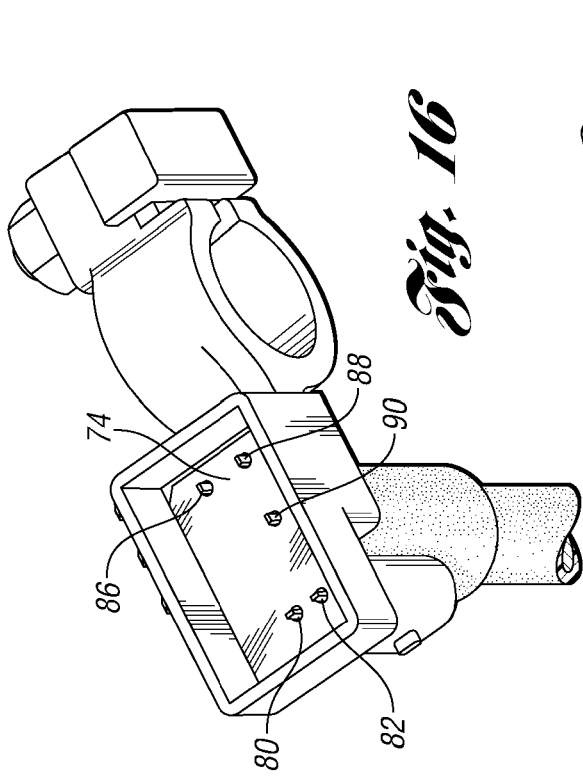

As shown in FIGS. 16-17, the PCB 74 may include five openings to correspond with the five pins described above. The PCB 74 may be spot welded/soldered to each of the pins 80, 82, 86, 88, 90. The PCB 74 may include any number of sensors and circuitry to perform any number of logical functions associated with determining the operating conditions of the battery 16 or other operations associated with or based on the connector and its function and performance. For example, the PCB 74 may include a temperature sensor (not shown) for sensing connector temperature and/or battery temperature.

The temperature sensor may be used to sense the battery temperature as a function of the terminal adapter 20 temperature. This may include establishing a thermal coupler or other element between the terminal adapter 20 and the PCB 74 so as to facilitate temperature sensing. A negative or positive temperature coefficient element may be included proximate the thermal coupler to facilitate sensing the temperature. One non-limiting aspect of the present invention contemplates attaching the temperature sensing couple to or in close proximity to the grounding pin 90.

Rather than having to solder the PCB 74 directly to the terminal 20 to sense terminal temperatures, the PCB temperature sensing component can be soldered to or in close proximity to the grounding pin 90. Temperature changes in the battery 16 that are carried through to the terminal 20 may be also be sufficiently reflected in the grounding pin 90 by way of its connection to the shunt 40, and the shunt 40 connection to the terminal adapter 20. Of course, soldering or other direction connection between the terminal 20 and PCB 74 or PCB components may be also be used. The grounding pin thermal couple, however, may be beneficial in that is can ease soldering temperatures since less heat is required to solder to the ground pin than to solder directly to the terminal.

The PCB 74 is illustrated for exemplary purposes and without intending to limit the scope and contemplation of the present invention. The present invention fully contemplates the use of any type of logically functioning processing element, such as but not limited to a discrete or integrated circuit, having properties sufficient to facilitate determining battery operating conditions, which may or may not be included on a PCB. The PCB 74 may fit within the sides of the housing 70 for electrical communication with the shunt tabs 86, 88, 90 and connector pins 80, 82. The PCB 74 may rest on the shoulders of the tabs 80, 82, 86, 88, 90 such that a portion of the tabs extend through a top side of the PCB 74.

Figure 19:
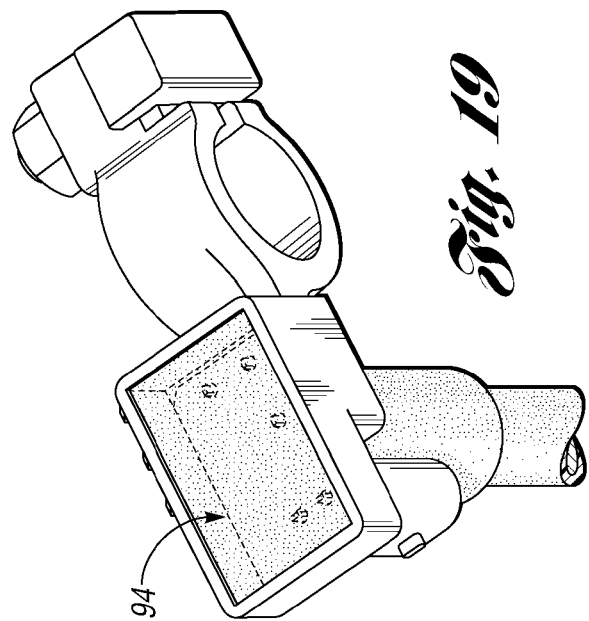
FIG. 19 illustrate a potting material of the BMS in accordance with one non-limiting aspect of the present invention.
Figure 18:
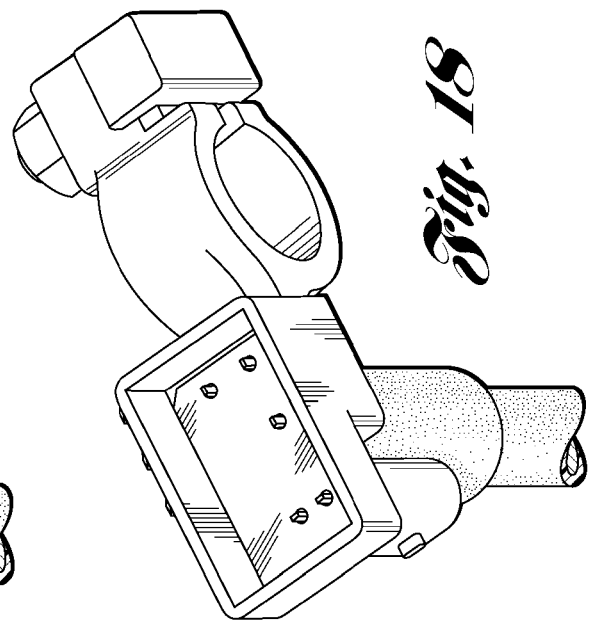

As shown in FIGS. 18-19, a non-conducting resin 94 may be filled in above the PCB 74 and within the side walls of the housing 70 to vibrationally and electrically isolate and waterproof the PCB 74. The resin 94 may be beneficial in to enhancing system integrity against contaminates, water, debris, etc. and/or to facilitate packaging and other component design. The resin may comprise any suitable material and be used to encase the connector features in a waterproof mold.

Figure 20:
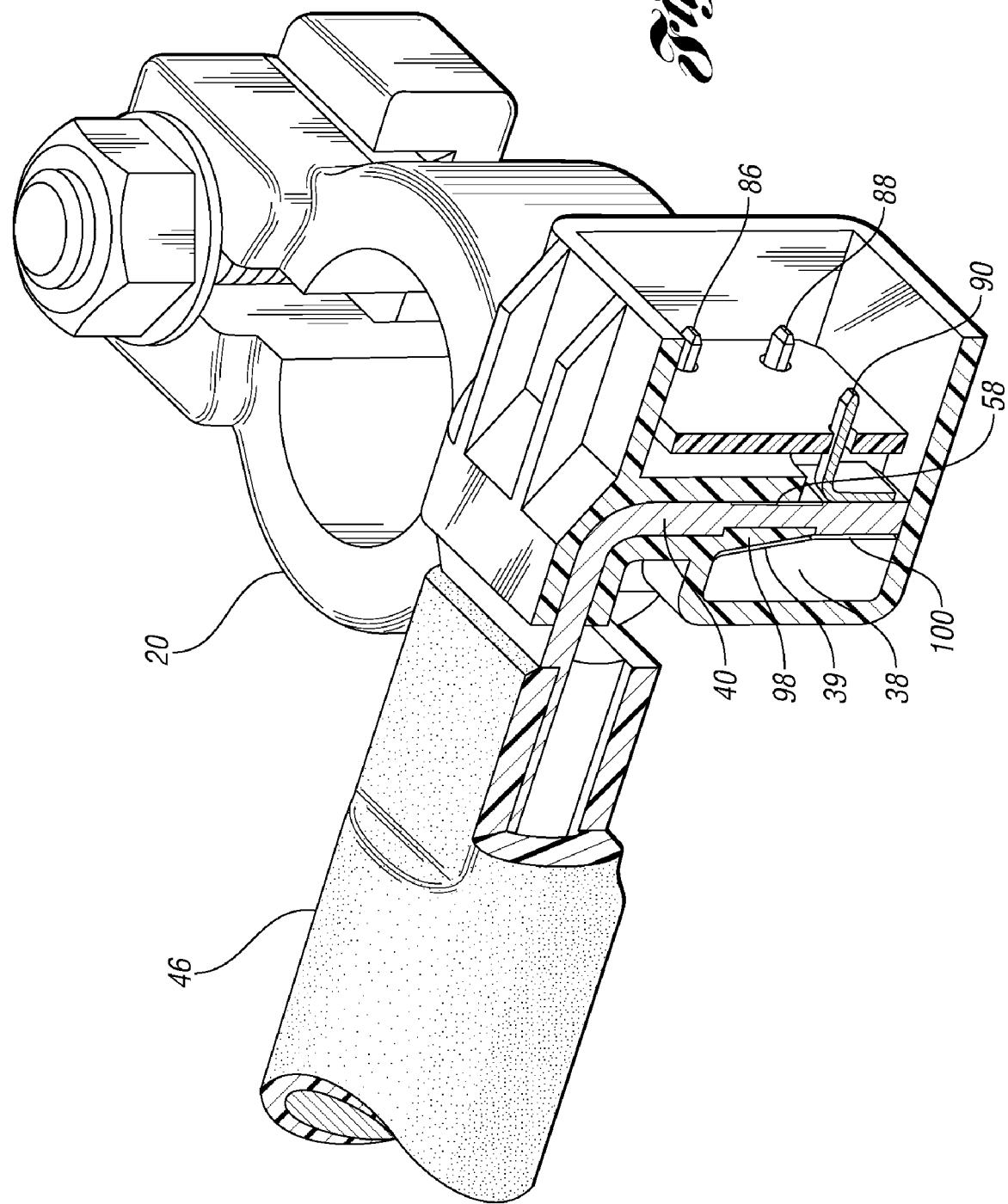
FIG. 20 illustrates a cross-sectional view of the BMS in accordance with one non-limiting aspect of the present invention.

FIG. 20 illustrates a cross-sectional view of the BMS 10 in accordance with one non-limiting aspect of the present invention. In this view, the grounding pin 90 is shown to be on the 'positive' side manganin portion 58. It maybe preferable to include the pin 90 on the other, 'negative' side. This view illustrates an isolating portion 98 of the housing 70 being injection molded within a gap between the angled portion of the second side 38" of the arm 38 and the measurement portion 58 on the first side 40' of the shunt 40. The isolating portion 98 may cover the face of the measurement portion 58 facing the second side 38" of the arm 38. The isolating portion may extend all the way down to a welded portion 100 used to electrically connect the second side 38" of the arm 38 to the first side 40' of the shunt 40.

The isolating portion 98 can be helpful in preventing shorting of the voltage measure across the manganin portion 58 should the wire 46 cause the shunt 40 to flex rearward. The angled portion 39 of the arm 98 may be angled to facilitate flow of the molding material into the gap between the arm 38 and shunt 40. The isolation portion 98 of the housing formed within the gap may also help limit vibration and other forces from acting between the shunt 40 and terminal 20. The isolation portion can act as damper and/or force linkage that helps transfer forces on the cable 46 to the arm 38 and away from the solder/weld connection made between the arm 38 and the shunt 40.

The shunt 40 described above in all embodiments of the present invention is shown to be a relatively planar shunt. The present invention fully contemplates the use of any type of shunt having any type of shape, including a shunt having a cylindrical shape. The present invention fully contemplates any number of connection methods to facilitate electrically connecting the terminals and PCB to the shunt and the use of any type of connector or soldering method to facilitate connecting to a cylindrical, planar, or other shaped shunt.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention. The features of various implementing embodiments may be combined to form further embodiments of the invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A battery monitoring system (BMS) for use in determining an amount of current drawn from a battery to power a load within a vehicle, the BMS comprising:
    a terminal having a connection element and an arm, the connection element being configured to be coupled to a post of the battery, the arm having a first arm side opposite a second arm side;
    a shunt having a first shunt end and a second shunt end, the first shunt end being configured to be welded to a cable connected to the load and the second shunt end having a first shunt side and a second shunt side where the first shunt side is welded to the second arm side with a weld, wherein at least a non-welded portion of the second arm side is not covered with the weld, the shunt having a measurement portion proximate the second shunt end;
    a housing comprised of a non-conducting material, the housing being shaped such that the non-conducting material covers at least part of the first arm side and at least part of the second shunt side, and wherein the housing is further shaped such that an isolating portion of the non-conducting material fills a gap between the second arm side and the first shunt side; and
    a current monitoring device within the housing, the current monitoring device being configured to determine the amount of current drawn from the battery as a function of a voltage drop across the measurement portion of the shunt.

2. The BMS of claim 1 wherein the measurement portion of the shunt is comprised of a material that is different from the rest of the shunt.

3. The BMS of claim 1 wherein the second shunt end has a substantially uniform cross-sectional dimension except at the measurement portion where the cross-sectional dimension is reduced to form a recess along a corresponding portion of the first shunt side.

4. The BMS of claim 3 wherein the isolating portion fills the entire recess with the non-conducting material.

5. The BMS of claim 1 wherein the arm has a substantial uniform cross-sectional dimension except above the weld where the cross-section dimension is angled inwardly toward the first arm side to define at least part of the gap.

6. The BMS of claim 2 wherein the isolating portion covers an entirety of the measurement portion facing the second arm side with the non-conducting material.

7. The BMS of claim 1 further comprising first and second shunt pins welded proximate opposite sides of the measurement portion to the second shunt side, wherein the current monitoring device measures the voltage drop across the first and second shunt pins.

8. The BMS of claim 7 further comprising a third pin weld to one of the opposite sides of the measurement portion, the third pin electrically grounding the current monitoring device to one side of the measurement portion.

9. The BMS of claim 8 further comprising a printed circuit board (PCB) attached to the current monitoring device, the PCB being grounded to the third pin.

10. The BMS of claim 8 further comprising a temperature measurement device connected to the third pin, the temperature measurement device configured to measure a temperature of the shunt.

11. The BMS of claim 1 wherein the connection element includes a pair of clamps configured to compressively tighten around the post.

12. The BMS of claim 10 wherein the connection element is on a side opposite of the arm.

13. The BMS of claim 1 wherein the housing is approximately 23.5 mm in height with an outer edge at approximately 45 mm from a center of the pole measured in a direction along the arm.

14. A battery monitoring system (BMS) comprising:
 a terminal having a connection element and an arm, the connection element being coupled to a battery and the arm extending away from the connection element;
 a shunt having a first end and a second end, the first end being connected to a load, the second end being attached to the arm such that a gap is formed therebetween, the shunt being composed of a first material and a second material, the first material being disposed on opposite first and second sides of the second material, the arm being attached to only the first material on the second side such that the gap is formed between the arm the and the second material;
 a housing molded to the arm and the shunt, the housing being shaped to fill the gap between the arm and the second material of the shunt with a non-conducting material; and
 a current monitoring device configured to determine current flow between the battery and load as a function of a voltage drop across the second material.

15. The BMS of claim 14 further comprising a cross-sectional dimension of the shunt corresponding with the second material being less than a cross-sectional dimension of the shunt corresponding with the first material.

16. The BMS of claim 14 wherein:
 the non-conducting material extends across an entire side of the second material that faces toward the arm;
 the gap is v-shaped;
 the shunt is L-shaped;
 the first end of the shunt is longer than the second end of the shunt;
 the first end is positioned over top of the gap and extends in a direction perpendicular to the arm.

17. The BMS of claim 14 further comprising first and second shunt pins connected proximate opposite sides of the second material, wherein the current monitoring device measures the voltage drop across the first and second shunt pins.

18. The BMS of claim 17 further comprising a third pin connected to the shunt, the third pin electrically grounding the current monitoring device to the shunt.

19. The BMS of claim 17 further comprising a third pin connected to the shunt and a temperature measurement device configured to measure a temperature of the third pin.

* * * * *